(12) United States Patent
Kato

(10) Patent No.: US 11,862,992 B2
(45) Date of Patent: Jan. 2, 2024

(54) POWER TRANSMISSION DEVICE AND POWER SUPPLY SYSTEM INCLUDING POWER TRANSMISSION DEVICE

(71) Applicant: TOSHIBA TEC KABUSHIKI KAISHA, Tokyo (JP)

(72) Inventor: Masakazu Kato, Numazu Shizuoka (JP)

(73) Assignee: Toshiba Tec Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/979,525

(22) Filed: Nov. 2, 2022

(65) Prior Publication Data

US 2023/0378815 A1    Nov. 23, 2023

(30) Foreign Application Priority Data

May 20, 2022   (JP) ................................ 2022-082898

(51) Int. Cl.
*H02J 50/60* (2016.01)
*G01R 19/165* (2006.01)
*H02J 50/10* (2016.01)

(52) U.S. Cl.
CPC ........ *H02J 50/60* (2016.02); *G01R 19/16538* (2013.01); *H02J 50/10* (2016.02)

(58) Field of Classification Search
CPC ...... H02J 50/60; H02J 50/10; G01R 19/16538
USPC ........................................................ 307/104
See application file for complete search history.

(56) References Cited

U.S. PATENT DOCUMENTS

| | | |
|---|---|---|
| 2012/0326524 A1 | 12/2012 | Matsumoto et al. |
| 2016/0126747 A1 | 5/2016 | Kato et al. |
| 2018/0262062 A1 | 9/2018 | Kato |
| 2019/0181693 A1* | 6/2019 | Kato ..................... B60L 53/126 |
| 2019/0267849 A1* | 8/2019 | Ha .......................... H02J 50/60 |
| 2019/0280534 A1* | 9/2019 | Park ..................... H04B 5/0037 |
| 2019/0296590 A1* | 9/2019 | Chae ........................ H02J 7/02 |
| 2020/0122762 A1 | 4/2020 | Kato |
| 2021/0075260 A1 | 3/2021 | Kato et al. |
| 2021/0135496 A1 | 5/2021 | Kato et al. |
| 2022/0109330 A1 | 4/2022 | Kato et al. |

OTHER PUBLICATIONS

Unpublished U.S. Appl. No. 17/852,249, filed Jun. 28, 2022, 51 pages.

* cited by examiner

*Primary Examiner* — Alfonso Perez Borroto
(74) *Attorney, Agent, or Firm* — Kim & Stewart LLP

(57) ABSTRACT

According to an embodiment, a power transmission device performs power transmission without contact with a power reception device. A control circuit of the power transmission device obtains, as a reference value, a standby current in a standby state in which the power transmission to the power reception device is not performed. The control circuit sets, as a foreign matter detection threshold, a value obtained by adding a constant value to the reference value or a value obtained by adding a constant ratio to the reference value. Further, in the standby state, when the current value input to the power transmission circuit and detected by the current detection circuit is equal to or larger than the threshold, the control circuit determines that there is a foreign matter on the power transmission coil.

10 Claims, 13 Drawing Sheets

POWER TRANSMISSION DEVICE AND POWER SUPPLY SYSTEM INCLUDING POWER TRANSMISSION DEVICE

CROSS-REFERENCE TO RELATED APPLICATIONS

This application is based upon and claims the benefit of priority from the prior Japanese Patent Application No. 2022-082898, filed on May 20, 2022, the entire contents of which are incorporated herein by reference.

FIELD

Embodiments described herein generally relate to a power transmission device and a power supply system including a power transmission device.

BACKGROUND

In recent years, a system has been devised, in which an electronic device is mounted on a cart (moving cart) such as a shopping cart operated by a user to provide various services. The cart is equipped with a battery that supplies power to the electronic device. A non-contact power transmission technique in which power is supplied in a non-contact manner to a cart housed in a housing position (predetermined housing location) is adopted as a charging system (power supply system) for the battery mounted on the cart. For example, in the power supply system, the cart includes a power reception coil. A power transmission coil for supplying power to the power reception coil of the cart housed in the housing position is provided in the housing position. Such a non-contact power transmission technique is also used in fields other than carts.

In a device that performs power transmission in a non-contact manner, when power is transmitted with a metal foreign matter being sandwiched between a power transmission coil and a power reception coil, there arises a problem that the metal foreign matter generates heat.

In this regard, for example, there is also known a technique in which the presence of a metal foreign matter is determined by detecting an input current from an external power supply and performing comparison with a preset foreign matter determination threshold. Further, in order to increase safety against the heat generation of a metal foreign matter, if the detection sensitivity of the metal foreign matter is increased by making the foreign matter determination threshold as small as possible, there is a possibility that the power transmission is not started due to erroneous detection.

DETAILED DESCRIPTION

According to an embodiment, a power transmission device performs power transmission without contact with a power reception device. The power transmission device includes a power transmission coil, a power transmission circuit, a current detection circuit, and a control circuit. The power transmission circuit generates transmission power and supplies the generated transmission power to the power transmission coil. The current detection circuit measures a current value input to the power transmission circuit. The control circuit measures, using the current detection circuit, a standby current in a standby state in which the power transmission to the power reception device is not performed, to obtain the measured current value as a reference value. The control circuit sets, as a foreign matter detection threshold, a value obtained by adding a constant value to the reference value or a value obtained by adding a constant ratio to the reference value. Further, the control circuit determines, in the standby state, when the current value detected by the current detection circuit is equal to or larger than the foreign matter detection threshold, that there is a foreign matter on the power transmission coil.

Figure 1:
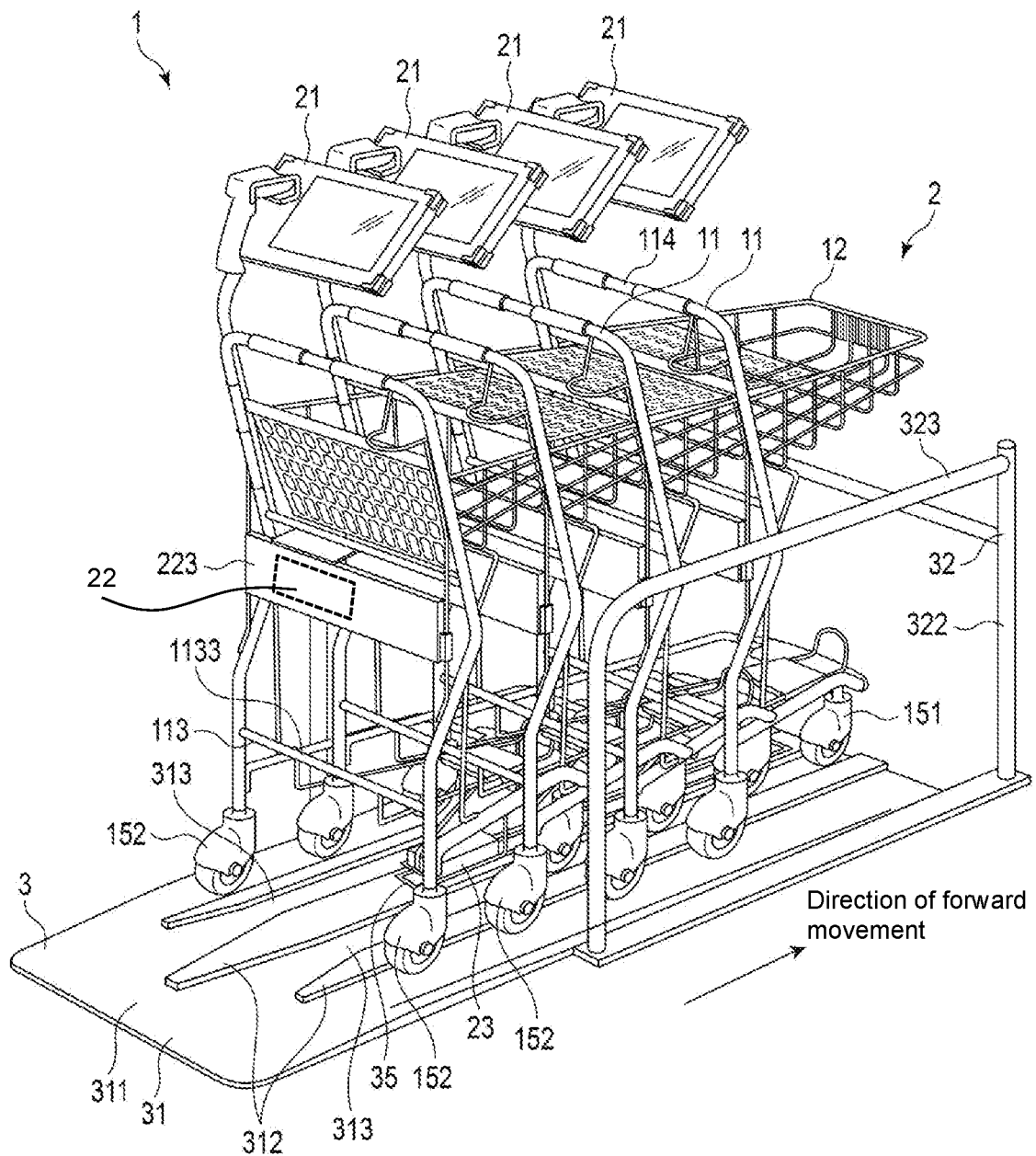
FIG. 1 is a perspective view showing a configuration of a power supply system according to a first embodiment.
Figure 2:
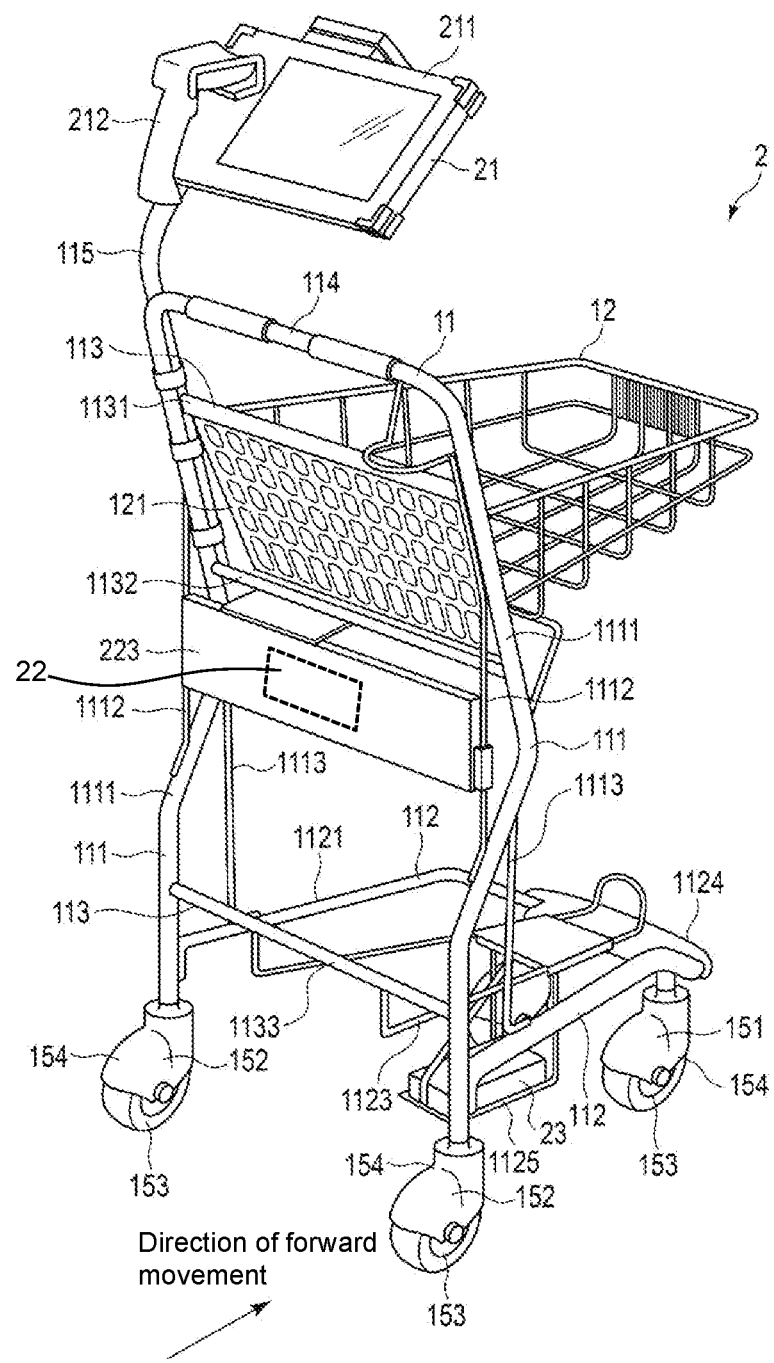
FIG. 2 is a perspective view showing a configuration of a cart of the power supply system according to the first embodiment.
Figure 3:
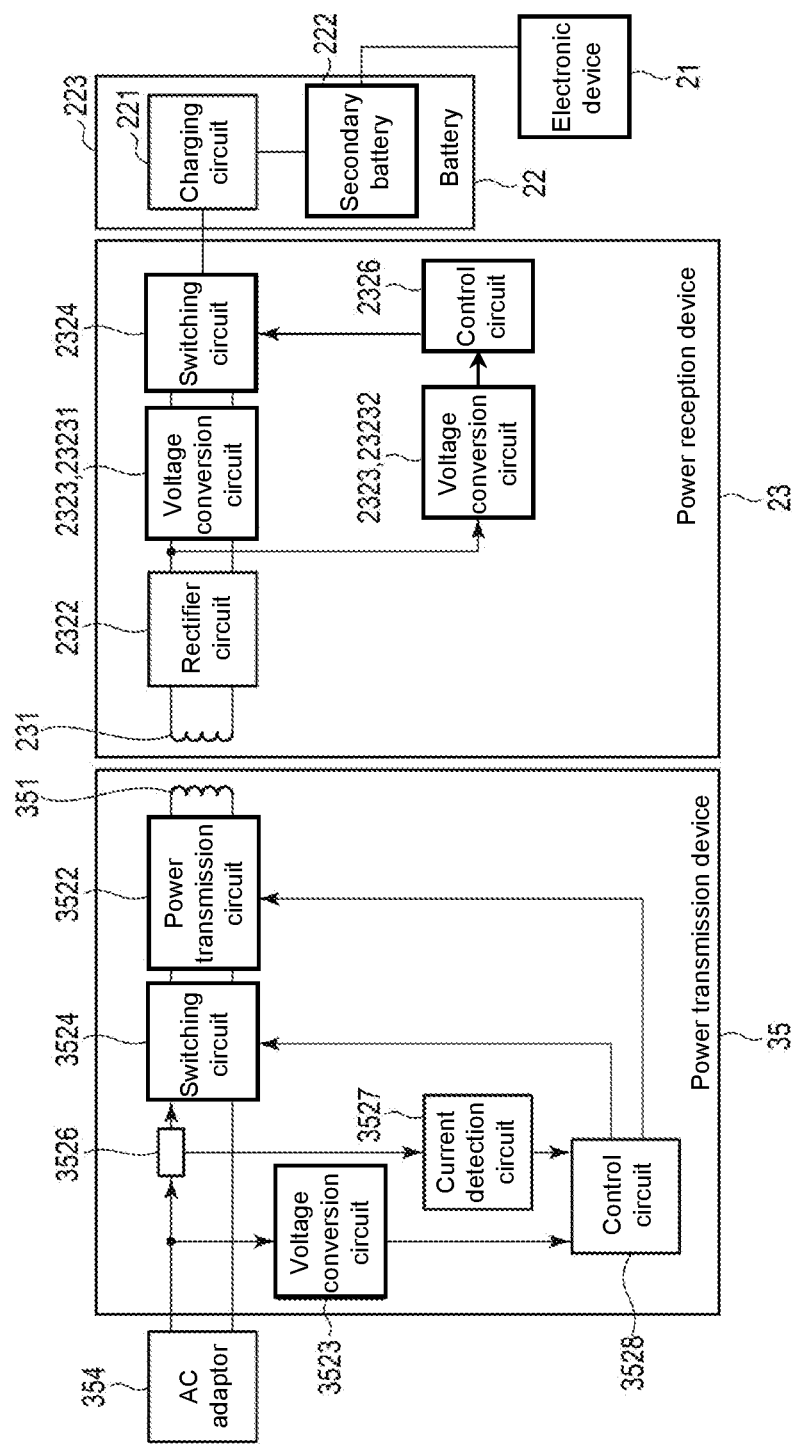
FIG. 3 is a block diagram showing a configuration of a control system of the power supply system according to the first embodiment.
Figure 4:
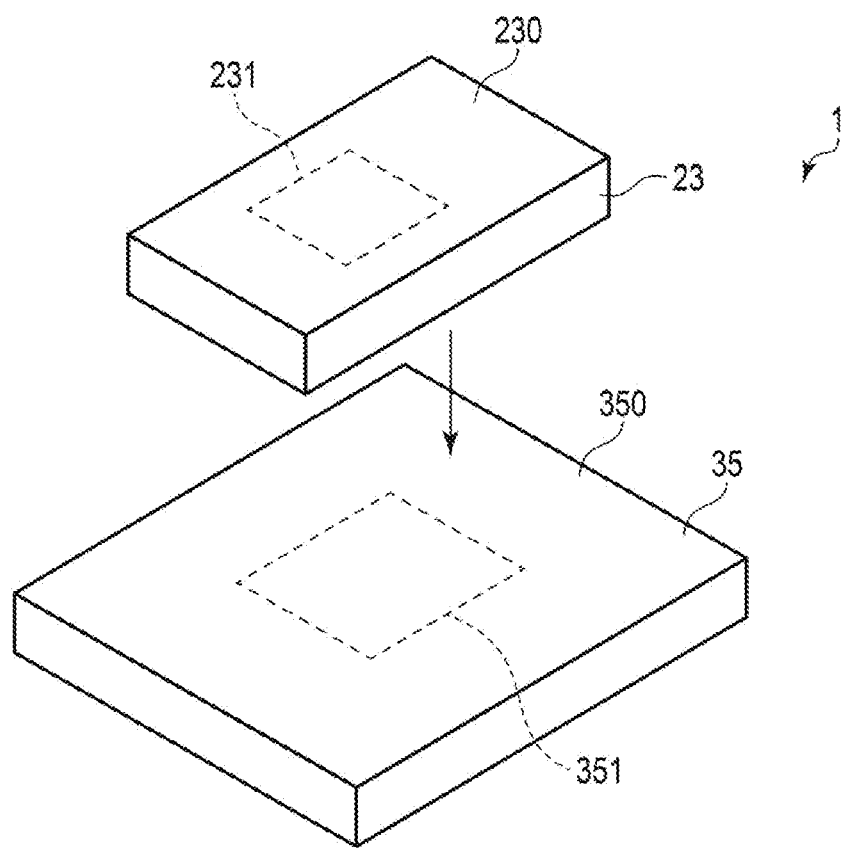
FIG. 4 is a perspective view showing configurations of a power reception device and a power transmission device of the power supply system according to the first embodiment.
Figure 5:
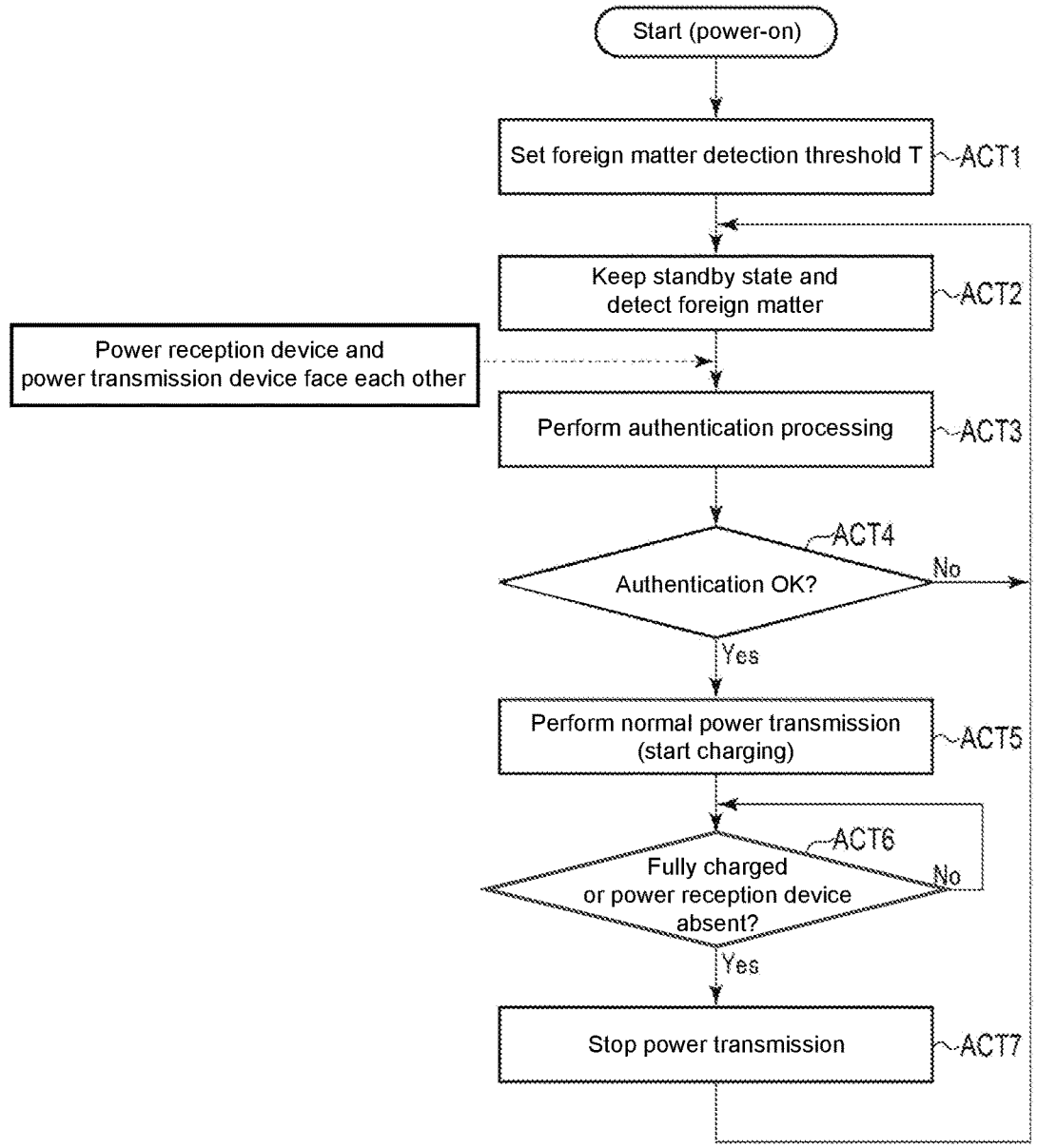
FIG. 5 is a flowchart showing an example of processing of the power transmission device of the power supply system according to the first embodiment.
Figure 6:
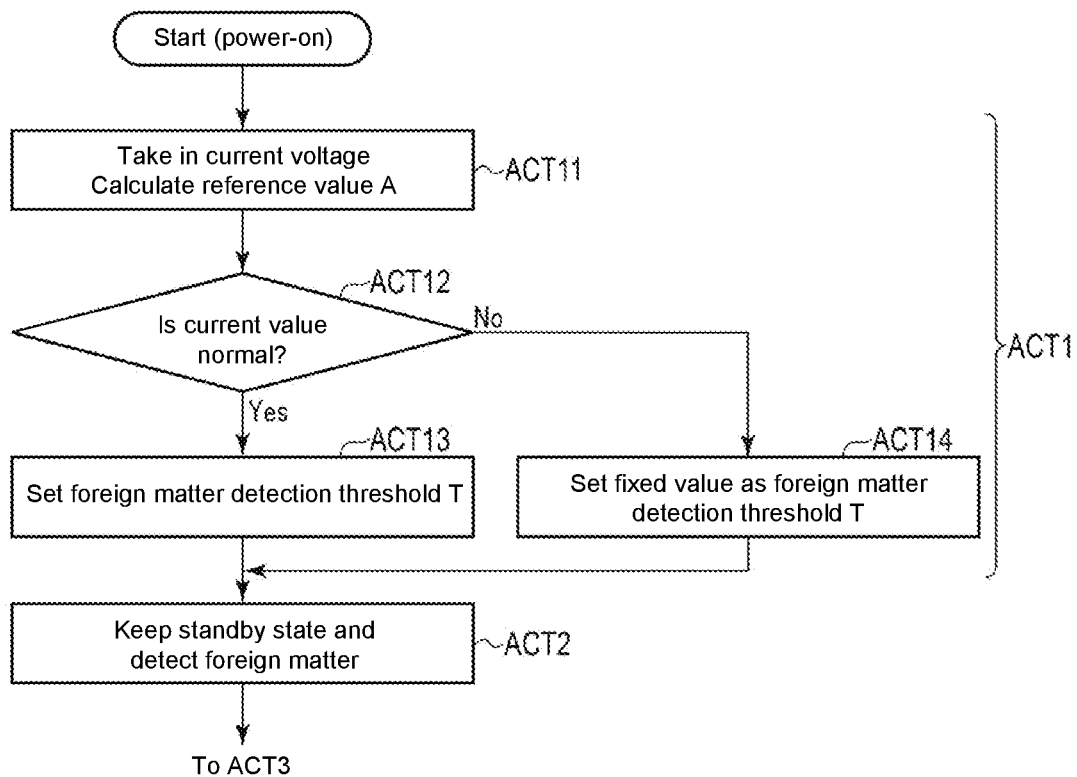
FIG. 6 is a flowchart showing an example of processing of setting a foreign matter detection threshold as an example of the processing of the power transmission device of the power supply system according to the first embodiment.
Figure 7:
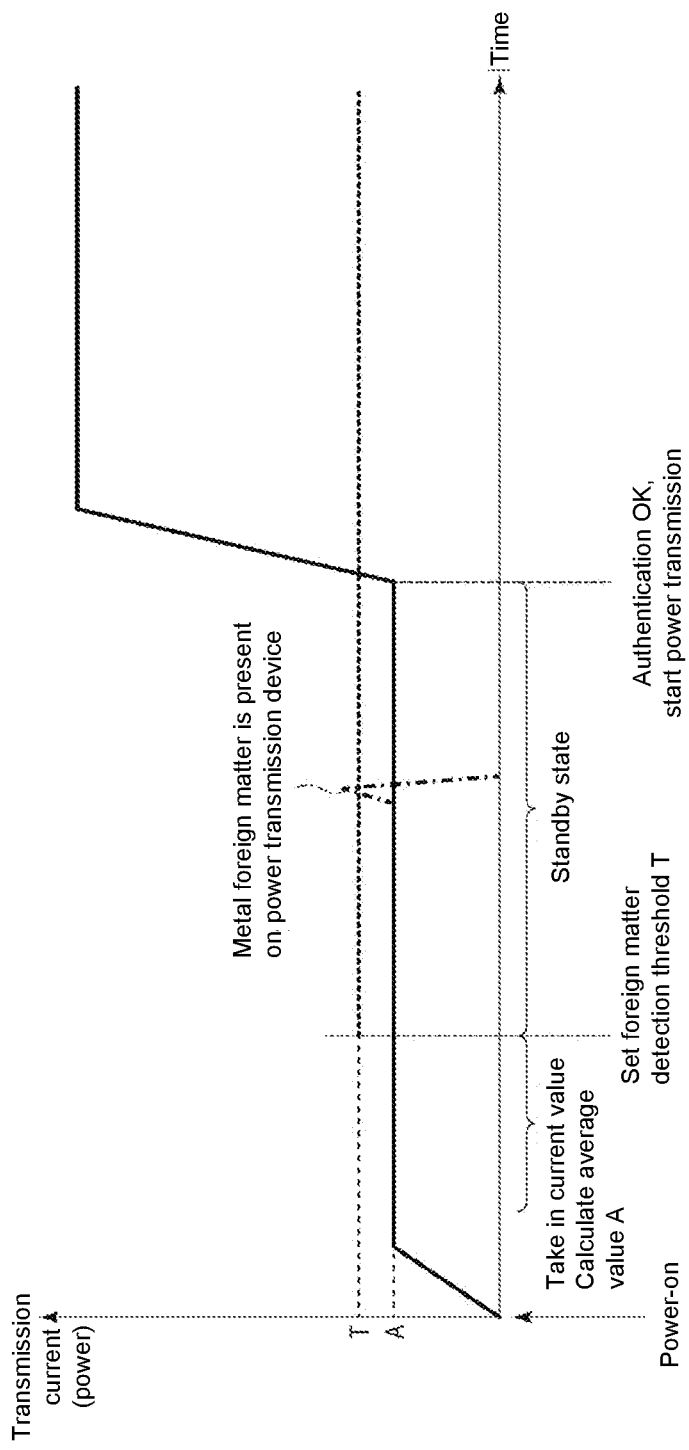
FIG. 7 is a diagram for describing an example of a change in transmission current by the power transmission device of the power supply system according to the first embodiment.
Figure 8:
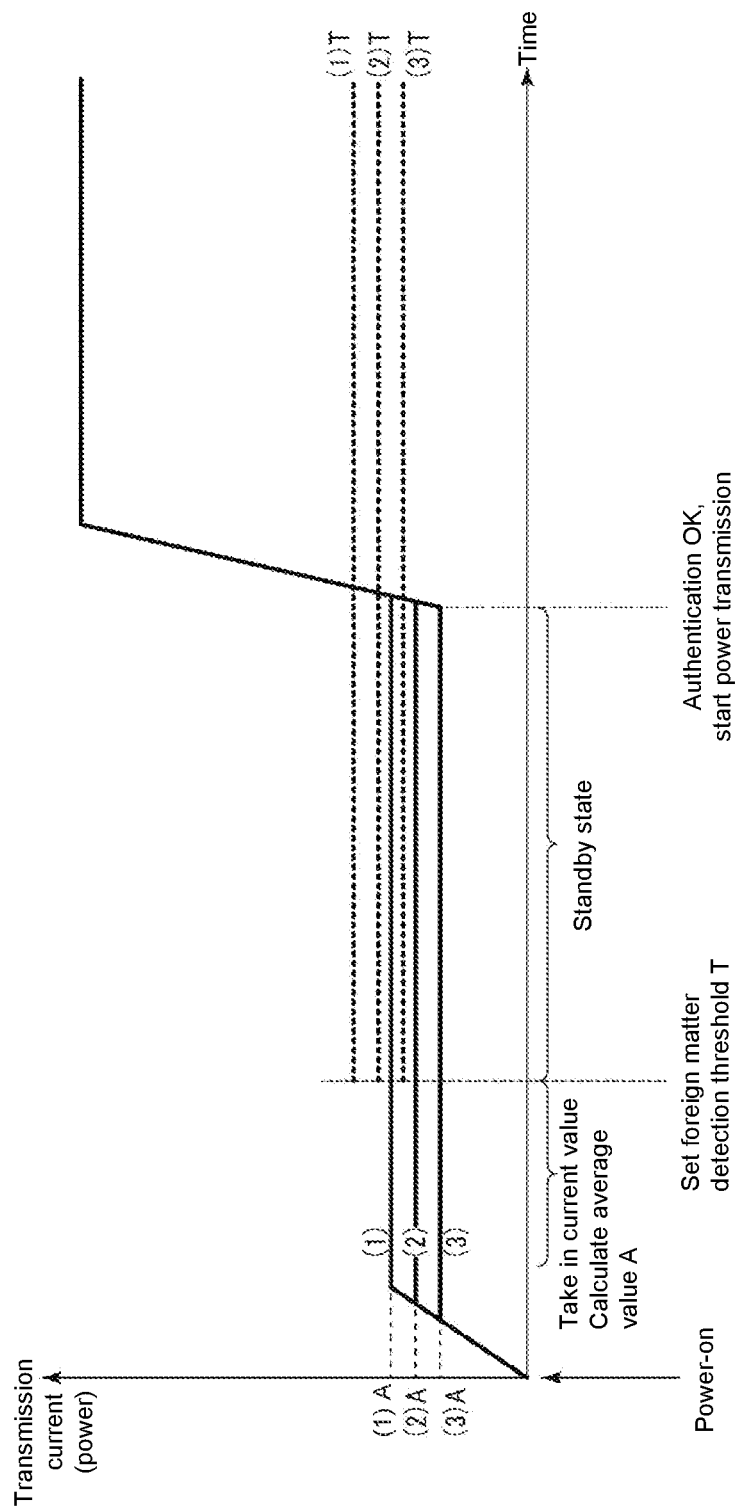
FIG. 8 is a diagram for describing an example of a change in transmission current by the power transmission device of the power supply system according to the first embodiment, showing an example of a standby current for each power transmission device.

Hereinafter, a power supply system 1 and a power transmission device 35 according to a first embodiment will be described with reference to FIGS. 1 to 8. In the drawings, the same reference symbols represent the same or similar portions. FIG. 1 is a perspective view showing a configuration of the power supply system 1 according to the first embodiment, and FIG. 2 is a perspective view of a cart 2 of the power supply system 1. FIG. 3 is a block diagram showing a configuration of a control system of the power supply system 1. FIG. 4 is a perspective view showing configurations of a power reception device 23 and the power transmission device 35. FIG. 5 is a flowchart showing an example of power transmission processing performed by the power transmission device 35, and FIG. 6 is a flowchart showing processing of setting a foreign matter detection threshold T in the power transmission processing performed by the power transmission device 35. FIG. 7 is a diagram for describing an example of a change in transmission current by the power transmission device 35, and FIG. 8 is diagram for describing an example of a change in transmission current by each power transmission device 35.

As shown in FIGS. 1 and 3, the power supply system 1 includes the power reception device 23 and the power transmission device 35. The power reception device 23 is provided to, for example, the cart 2. For example, a plurality of power transmission devices 35 are provided to a cart base 3 that houses a plurality of carts 2. In the following description of the embodiment, an example in which the power reception device 23 and the power transmission device 35 are respectively applied to the cart 2 and the cart base 3 in the power supply system 1 will be described.

As shown in FIG. 1, the power supply system 1 includes the cart 2 including the power reception device 23, and the cart base 3 in which the carts 2 are installed and which includes the plurality of power transmission devices 35. In the power supply system 1, in the cart base 3 in which the plurality of power transmission devices 35 are disposed side by side in one direction, the plurality of carts 2 each including the power reception device 23 are housed side by side in one direction, and the plurality of power transmission devices 35 and the plurality of power reception devices 23 are disposed to face each other at predetermined intervals.

The cart 2 shown in FIG. 2 is a moving object and is a shopping cart, for example. The cart 2 includes a frame 11, a basket portion 12, front and rear casters 151 and 152, an electronic device 21, a battery box 223 in which a battery 22 (object to be supplied with power) is provided, and the power reception device 23.

The frame 11 is formed by assembling a plurality of frame members extending in different directions. The frame 11 supports the basket portion 12, the plurality of casters 151 and 152, various electronic devices 21, and the power reception device 23 at predetermined positions.

The frame 11 includes, for example, a pair of right and left vertical frame portions 111, a lower frame portion 112, a horizontal frame portion 113, a handle portion 114, and a mounting frame 115. The vertical frame portions 111, the lower frame portion 112, and the horizontal frame portion 113 extend in directions intersecting with each other.

The vertical frame portions 111 include a pair of main frames 1111 extending upward from the rear wheel casters 152, a pair of sub-frames 1112 provided on the rear side of the main frames 1111, and a pair of sub-frames 1113 provided on the front side of the main frames 1111. The vertical frame portions 111 extend in the vertical direction behind the basket portion 12, and the rear wheel casters 152 are disposed at the lower end portions of the vertical frame portions 111.

The lower frame portion 112 includes a plurality of frame members disposed along the floor surface. The lower frame portion 112 includes, for example, a pair of main frames 1121, a support frame 1123, a front coupling portion 1124, and an mounting portion 1125 provided below the support frame 1123. The main frames 1121 extend forward from the rear wheel casters 152 toward the front wheel casters 151.

The support frame 1123 is a frame member that extends downward from the horizontal frame portion 113, bends forward at a predetermined height, extends forward, and bends upward at a front end portion. The support frame 1123 is formed of, for example, a U-shaped frame member bent and folded back on the front side. The support frame 1123 extends along a plane parallel to the floor surface on the inward side of the main frame 1121. The support frame 1123 forms a place for a basket on the upper side thereof.

The front coupling portion 1124 extends in the width direction at the front end portion of the lower end of the cart 2, and couples the front ends of the pair of main frames 1121.

An upper end portion of the mounting portion 1125 is fixed to a predetermined position of the support frame 1123. The mounting portion 1125 extends downward from the support frame 1123, bends backward at a predetermined height, and extends backward. The mounting portion 1125 is a frame member on which the power reception device 23 is mounted. The mounting portion 1125 extends along a plane parallel to the floor surface on the inward side of the main frame 1121, and forms a support surface that supports the power reception device 23 below the support frame 1123. For example, the mounting portion 1125 is set to have a dimension, in which the power transmission device 35 provided on the cart base 3 and the power reception device 23 provided on the mounting portion 1125 are disposed to face each other with a predetermined interval therebetween when the cart 2 is installed in the cart base 3.

The horizontal frame portion 113 includes a plurality of link frames 1131, 1132, and 1133 that are bridged between the right and left vertical frame portions 111 and extend in the width direction.

The handle portion 114 is disposed at the upper rear end portion of the cart 2. The handle portion 114 is disposed to be continuous with the upper end portions of the vertical frame portions 111. As an example, the handle portion 114 extends in the width direction.

The mounting frame 115 is connected to the vertical frame portion 111. For example, the mounting frame 115 extends upward at one of the vertical frame portions 111 and supports the various electronic devices 21.

In the frame 11, the basket portion 12 is supported by the vertical frame portions 111. The front wheel casters 151 and the rear wheel casters 152 are respectively provided at the front end portions and the rear end portions of the lower frame portion 112 disposed below the basket portion 12. Further, in the frame 11, the power reception device 23 is provided on the mounting portion 1125, of the lower frame portion 112, which is a frame member disposed along the floor surface. In addition, the battery box 223 is provided to the vertical frame portions 111. For example, the battery box 223 is supported by the pair of sub-frames 1112 of the vertical frame portions 111.

Further, in the lower frame portion 112, the pair of main frames 1121 extend in a forward direction obliquely toward the center such that the distance therebetween in the width direction on the front side is narrowed. Therefore, the frame 11 is formed to have a narrow front-side width and a wide rear-side width in the direction of forward movement of the cart 2.

The basket portion 12 is formed in a box shape that is open upward by, for example, a perforated panel member or a mesh-shaped wire member. The basket portion 12 is formed to be capable of housing commodities or to be capable of placing a shopping basket for housing commodities. The basket portion 12 is disposed at a height spaced upward from the floor surface in front of the vertical frame portions 111. The right and left sides of the rear end portion of the basket portion 12 are supported by the vertical frame portions 111.

The front wheel casters 151 and the rear wheel casters 152 each have a wheel 153 that rotates in the moving direction, and a bracket portion 154 that rotatably supports the wheel 153. The bracket portion 154 is rotatably mounted to the frame 11. As the wheels 153 of the casters 151 and 152 rotate on the floor surface, the cart 2 moves. Further, the traveling direction of the cart 2 can be changed by the rotation of the bracket portions 154 of the casters 151 and 152.

As in the case of the shapes of the frame 11 and the basket portion 12, the front wheel casters 151 on the front side are disposed so as to have a narrower width therebetween than the width between the rear wheel casters 152 on the rear side. Therefore, for example, when the plurality of carts 2 are connected before and behind to be housed in the cart base 3 in series (see FIG. 1), the frame 11 of a cart 2 on the rear side can be housed so as to overlap along the frame 11 of a cart 2 on the front side.

The electronic device 21 is an information terminal such as a tablet terminal for providing information to a user, or a commodity reader for acquiring information on a commodity selected by the user. The electronic device 21 is connected to, for example, the battery 22. The electronic device 21 is driven by the power supplied from the battery 22. The electronic device 21 may be, for example, a charger for charging an electronic device of a portable terminal owned by a user, such as a mobile phone, a smartphone, or a digital camera, with the power supplied from the battery 22.

In this embodiment, for example, the electronic device 21 includes a tablet terminal 211 and a commodity reader 212. The tablet terminal 211 is a computer including a display unit provided with a touch panel. The tablet terminal 211 is installed with the display unit facing a user who is close to the handle portion 114. The tablet terminal 211 displays, for example, information of a commodity read by the commodity reader 212. Further, the tablet terminal 211 may perform checkout processing of the commodity read by the commodity reader 212.

The commodity reader 212 is a device that reads information of a commodity. Further, the commodity reader 212 may include a display unit that displays information of the read commodity. The commodity reader 212 is, for example, a radio-frequency identification (RFID) tag reader that reads an RFID tag or the like attached to a commodity to be taken in and out of the basket portion 12. Further, the commodity reader 212 may be a scanner that reads commodity identification information such as a bar code attached to a commodity.

Note that the electronic device 21 may be an interface device for connecting a portable terminal (a smartphone, a tablet terminal, or the like) owned by a user in place of the tablet terminal 211. The portable terminal connected to the interface device serving as the electronic device 21 may perform processing similar to that of the tablet terminal 211 described above. Further, the interface device serving as the electronic device 21 may charge a battery included in the portable terminal. Note that the interface device serving as the electronic device 21 may include a built-in battery 22 or may be connected to a battery 22 separately provided.

The battery box 223 is provided to the frame 11. The battery box 223 is fixed to and supported by, for example, the pair of sub-frames 1112 disposed below an opening and closing panel 121 of the basket portion 12. The battery 22 is a power supply device that supplies power to the electronic device 21 mounted on the cart 2, and includes a charging circuit 221 and a secondary battery 222 as shown in FIG. 3. The battery 22 is connected to the power reception device 23 and is charged by the power reception device 23.

The charging circuit 221 supplies the power, which is supplied from a switching circuit 2324 of the power reception device 23 to the secondary battery 222, as power for charging (charging power). For example, the charging circuit 221 converts the power supplied from the switching circuit 2324 into a direct current (charging power) to be used for charging the secondary battery 222. In other words, the charging circuit 221 converts the power supplied from the switching circuit 2324 into the charging power having a predetermined current value and a predetermined voltage value for charging the secondary battery 222, and supplies the charging power to the secondary battery 222. The charging circuit 221 charges the secondary battery 222 by the power supplied from the power reception device 23.

The secondary battery 222 is charged by the charging power supplied from the charging circuit 221. Further, the secondary battery 222 is connected to the electronic device 21 and supplies power to the electronic device 21.

The power reception device 23 receives power transmitted in a non-contact manner, and supplies the received power to the electronic device 21 or the battery 22. Note that the power reception device 23 may be configured to include an output terminal that supplies power to the electronic device 21. In this case, the battery 22 may be configured to be charged by the power supplied through the electronic device 21.

The power reception device 23 is provided at the lower portion of the cart 2. The power reception device 23 is disposed below the lower frame portion 112, for example. When the cart 2 is kept (housed) in the cart base 3, the power reception device 23 faces any one of the plurality of power transmission devices 35 provided in the cart base 3 (see FIG. 1).

As shown in FIG. 4, the power reception device 23 includes, for example, a casing 230, a power reception coil 231, and a power reception substrate.

The casing 230 is, for example, a rectangular casing and houses the power reception coil 231 and the power reception substrate therein. The casing 230 is provided below the lower frame portion 112, for example. As a specific example, the casing 230 is fixed to the mounting portion 1125 of the lower frame portion 112.

The lower surface of the casing 230 is disposed on the cart 2 at a posture along the floor surface on which the cart 2 travels. The casing 230 has a shape that does not overlap with the casings 230 of power reception devices 23 of carts 2 adjacent before and behind in the direction of the forward movement of the cart 2 when the plurality of carts 2 are stacked and kept in the cart base 3 in series (see FIG. 1). Further, the casing 230 is disposed at a position that does not overlap with or interfere with the power reception devices 23 of carts 2 adjacent before and behind in the direction of the forward movement of the cart 2 when the plurality of carts 2 are stacked and kept in the cart base 3 in series.

The power reception coil 231 is disposed in the casing 230. The power reception coil 231 is, for example, a planar coil formed by winding a litz wire. Alternatively, the power reception coil 231 is a planar coil obtained by forming a winding wire as a coil pattern on a printed circuit board. The power reception coil 231 has, for example, a flat power reception surface for receiving power. The power reception surface of the power reception coil 231 is disposed so as to face the floor surface on which the cart 2 travels. Note that the power reception coil 231 is not limited to the planar coil as long as it can perform power transmission with the power transmission device 35.

The power reception coil 231 is electromagnetically coupled to a power transmission coil 351 when the power reception device 23 faces the power transmission device 35. The power reception coil 231 generates an induced current by the magnetic field output from the power transmission coil 351 of the power transmission device 35. The power reception coil 231 constitutes, for example, a power reception resonance circuit (resonance element).

Here, the power reception resonance circuit functions as, for example, an alternating current (AC) power supply that supplies AC power to a rectifier circuit 2322 connected to the power reception resonance circuit. For example, when a magnetic field resonance method is used for power transmission, it is desirable that the resonance frequency of the power reception resonance circuit be the same as or substantially the same as the resonance frequency of a power transmission resonance circuit constituted by the power transmission coil 351, which will be described later, of the power transmission device 35. This improves the power transmission efficiency when the power reception resonance circuit and the power transmission resonance circuit are electromagnetically coupled to each other. Note that the power reception resonance circuit may be configured to use an electromagnetic induction method for power transmission.

As shown in FIG. 3, the power reception substrate of the power reception device 23 includes the rectifier circuit 2322, voltage conversion circuits 2323, a switching circuit 2324, and a control circuit 2326. The power reception substrate mounts, for example, electronic components and wiring patterns, thus constituting various processing circuits including the rectifier circuit 2322, the voltage conversion circuits 2323, the switching circuit 2324, the control circuit 2326, and the like.

The rectifier circuit 2322 rectifies the AC power supplied from the power reception resonance circuit constituted by the power reception coil 231, and converts the AC power into direct current (DC) power. The rectifier circuit 2322 includes, for example, a rectifier bridge formed of a plurality of diodes. A pair of input terminals of the rectifier bridge is connected to the power reception resonance circuit. The rectifier circuit 2322 performs full-wave rectification of the AC power supplied from the power reception resonance circuit to output DC power from a pair of output terminals. The rectifier circuit 2322 supplies the DC power to the voltage conversion circuits 2323.

The voltage conversion circuit 2323 converts a DC voltage output from the rectifier circuit 2322 into a desired DC voltage. For example, two voltage conversion circuits 2323 are provided. Description will be given on one voltage conversion circuit 2323 referred to as a voltage conversion circuit 23231 and the other voltage conversion circuit 2323 referred to as a voltage conversion circuit 23232. The one voltage conversion circuit 23231 is connected to, for example, the rectifier circuit 2322 and the switching circuit 2324. The one voltage conversion circuit 23231 converts the DC power supplied from the rectifier circuit 2322 into DC power having a voltage suitable for the charging processing. The other voltage conversion circuit 23232 is connected to the rectifier circuit 2322 and the control circuit 2326. The other voltage conversion circuit 23232 converts the DC power supplied from the rectifier circuit 2322 into the DC power suitable for the voltage for operating the control circuit 2326.

The switching circuit 2324 switches connection and disconnection between the voltage conversion circuit 23231 and the charging circuit 221. The switching circuit 2324 switches connection and disconnection between the voltage conversion circuit 23231 and the charging circuit 221 on the basis of, for example, a signal from the control circuit 2326.

The control circuit 2326 controls the operation of the switching circuit 2324. The control circuit 2326 is a processing circuit. The control circuit 2326 includes, for example, a processor and a memory. The processor executes arithmetic processing. The processor performs various types of processing on the basis of, for example, programs stored in the memory and data used in the programs. The memory stores programs, data used in the programs, and the like. The control circuit 2326 may include a microcomputer, an oscillation circuit, and/or the like.

As shown in FIGS. 1 and 2, the cart 2 is housed in the cart base 3 provided at a predetermined housing position. In FIGS. 1 and 2, the plurality of carts 2 are housed in the cart base 3 in a nested manner.

As shown in FIG. 1, the cart base 3 as a housing apparatus for housing the carts 2 includes a guide base 31 as a base portion, a cart gate 32, and the plurality of power transmission devices 35 supported by the guide base 31.

The guide base 31 includes a plate-shaped support base 311 that is laid at a predetermined housing position. The support base 311 includes, on its upper surface, a plurality of guide rails 312 extending in one direction and guide grooves 313 formed between the plurality of guide rails 312. Further, the support base 311 includes projections and grooves for guiding the plurality of carts 2 to the housing position. The guide base 31 guides the travel of the cart 2 on the support base 311 by restricting the movement of the front and rear wheels 153 of the cart 2 by the guide rails 312 and the guide grooves 313. Further, the guide base 31 supports the plurality of power transmission devices 35 at regular intervals.

The cart gate 32 includes a pair of poles 322 vertically provided from both side portions of the guide base 31, and side bars 323 disposed at predetermined heights at both side edges of the guide base 31 and extending in one direction.

For example, the plurality of power transmission devices 35 are provided between the pair of guide grooves 313 of the guide base 31, in which the pair of front wheels 153 of the cart 2 is guided. The plurality of power transmission devices 35 are disposed side by side in the extending direction of the pair of guide grooves 313 of the guide base 31. Here, the extending direction of the guide grooves 313 is a traveling direction of the cart 2 in the guide base 31. In other words, the extending direction of the guide grooves 313 is a stacking direction of the plurality of carts 2 in the guide base 31. The plurality of power transmission devices 35 face the power reception devices 23 of the plurality of carts 2 stacked and kept in the cart base 3. The power transmission device 35 transmits power to the power reception device 23 of the cart 2 opposed thereto in a non-contact manner.

As shown in FIG. 4, the power transmission device 35 includes, for example, a casing 350, the power transmission coil 351, a power transmission substrate, and an AC adaptor 354 (see FIG. 3).

The casing 350 is formed in a rectangular box shape, for example. The casing 350 houses the power transmission coil 351 and the power transmission substrate therein. The casing 350 faces the power reception device 23 of the cart 2 housed in the cart base 3 with a predetermined interval therebetween. The distance between the casing 350 and the casing 230 of the power reception device 23 is several mm, as a specific example, 1 mm to 10 mm.

The power transmission coil 351 is, for example, a planar coil formed by winding a litz wire. Alternatively, the power transmission coil 351 is a planar coil obtained by forming a winding wire as a coil pattern on a printed circuit board. The power transmission coil 351 has, for example, a flat power transmission surface for transmitting power.

The power transmission surface of the power transmission coil 351 is disposed along the floor surface on which the cart 2 travels. Further, the power transmission surface of the power transmission coil 351 extends along the power reception surface of the power reception coil 231 provided to the opposed cart 2 housed in the cart base 3. The power transmission coils 351 of the plurality of power transmission devices 35 are provided at positions facing the power reception coils 231 of the power reception devices 23 of the plurality of carts 2 housed in the cart base 3.

When the power reception device 23 and the power transmission device 35 face each other, the power transmission coil 351 is electromagnetically coupled to the power reception coil 231.

The power transmission coil 351 constitutes, for example, a power transmission resonance circuit (resonance element) as a power transmission unit.

Here, it is desirable that the resonance frequency of the power transmission resonance circuit constituted by the power transmission coil 351 be the same as or substantially the same as the oscillation frequency of an oscillation circuit of a control circuit 3528. This improves the power transmission efficiency when the power reception resonance circuit and the power transmission resonance circuit are electromagnetically coupled to each other. Note that the power transmission resonance circuit may use an electromagnetic induction method for power transmission.

The power transmission substrate includes a power transmission circuit 3522, a voltage conversion circuit 3523, a switching circuit 3524, a current sensor 3526, a current detection circuit 3527, and the control circuit 3528. The power transmission substrate mounts, for example, electronic components and wiring patterns, thus constituting various processing circuits including the power transmission circuit 3522, the voltage conversion circuit 3523, the switching circuit 3524, the current sensor 3526, the current detection circuit 3527, the control circuit 3528, and the like.

The power transmission circuit 3522 generates transmission power and supplies the generated transmission power to the power transmission coil 351. For example, the power transmission circuit 3522 generates AC power as transmission power by switching the DC power supplied via the AC adaptor 354 or the like under the control of the control circuit 3528. The power transmission coil 351 outputs power, which can be received by the power reception device 23, in accordance with the transmission power supplied from the power transmission circuit 3522. The power transmission circuit 3522 generates AC power having the same or substantially the same frequency as the resonance frequency of the power transmission resonance circuit. The power transmission circuit 3522 includes a switching element such as a field-effect transistor (FET). The power transmission circuit 3522 switches on and off by the output of the oscillation circuit of the control circuit 3528. The power output from the power transmission circuit 3522 is transmitted to the power reception device 23 by using electromagnetic coupling such as electromagnetic induction or magnetic field resonance between the power transmission coil 351 and the power reception coil 231.

The voltage conversion circuit 3523 converts, for example, a voltage of a DC power supply, which is supplied via the AC adaptor 354 or the like connected to a commercial power supply, into a desired DC voltage. As a specific example, the voltage conversion circuit 3523 generates power for operating the control circuit 3528 and supplies the power to the control circuit 3528.

The switching circuit 3524 switches connection and disconnection between the AC adaptor 354 and the power transmission circuit 3522. The switching circuit 3524 switches the state of power supply from the power transmission device 35 to the power reception device 23 by connecting or disconnecting the AC adaptor 354 and the power transmission circuit 3522 on the basis of the control signal from the control circuit 3528. For example, the switching circuit 3524 supplies either the DC power of the voltage supplied from an external DC power source or the DC power of the voltage obtained by stepping down the DC power supplied from the external DC power source by the voltage conversion circuit 3523 to the power transmission circuit 3522. The switching circuit 3524 switches the DC power to be supplied to the power transmission circuit 3522 under the control of the control circuit 3528.

The current sensor 3526 detects a direct current input to the power transmission circuit 3522. The current sensor 3526 is a minute resistance connected between the switching circuit 3524 and the power transmission circuit 3522. The current sensor 3526 generates a potential (current detection signal) corresponding to the current transmitted from the switching circuit 3524 to the power transmission circuit 3522.

The current detection circuit 3527 amplifies the minute signal detected by the current sensor 3526 and outputs the amplified minute signal to the control circuit 3528. The current detection circuit 3527 measures a current value input to the power transmission circuit 3522, for example. Note that the current value input to the power transmission circuit 3522 may be measured by the current sensor 3526 or by the current sensor 3526 and the current detection circuit 3527.

The control circuit 3528 controls the operation of the power transmission circuit 3522. The control circuit 3528 is a processing circuit. The control circuit 3528 includes, for example, a processor and a memory. The processor executes arithmetic processing. The processor performs various types of processing on the basis of, for example, programs stored in the memory and data used in the programs. The memory stores programs, data used in the programs, and the like. The control circuit 3528 may include a microcomputer, an oscillation circuit, and/or the like.

For example, the control circuit 3528 controls the frequency of the AC power output from the power transmission circuit 3522 and controls ON and OFF of the operation of the power transmission circuit 3522. For example, the control circuit 3528 controls the switching circuit 3524 to switch between a state in which a magnetic field is generated in the power transmission coil 351 (power transmission state) and a state in which a magnetic field is not generated in the power transmission coil 351 (standby state). Further, the control circuit 3528 may control the power transmission coil 351 to intermittently generate a magnetic field to change the timing of power transmission.

When power is supplied from the AC adaptor 354 and is turned on, the control circuit 3528 measures a standby current in the standby state (at the standby time) of the power transmission unit after the power is turned on by the current sensor 3526 and/or the current detection circuit 3527, and sets the measured current value as a reference value A. Alternatively, the control circuit 3528 measures a standby current in the standby state after stopping the power transmission to the power reception device 23 by the current sensor 3526 and/or the current detection circuit 3527, and sets the measured current value as a reference value A.

For example, the processor of the control circuit 3528 stores the set reference value A in the memory. As a specific example, the control circuit 3528 operates the power transmission unit at the same power supply voltage as that in the standby state, measures the transmission current by a predetermined number of times n at predetermined intervals s, calculates an average value thereof, and sets the average value as a reference value A.

For example, as shown in the diagram for describing the relationship between the time and the transmission current (power) in FIG. 7, when the power transmission device 35 is turned on and is in the standby state, the standby current, which is a current equivalent to the reference value A, flows through the power transmission circuit 3522. At that time, since the current value of the standby current fluctuates within a predetermined range, the control circuit 3528 estimates a reference value A by measuring the current value by a predetermined number of times n at predetermined intervals s and calculating an average value thereof. Further, as shown in the diagram for describing the relationship between the time and the transmission current (power) in FIG. 8, the standby current (reference value A) of each power transmission device 35 differs, as indicated by the solid lines (1) to (3), depending on the variations in the characteristics of the power transmission devices 35 and the installation environments of the power transmission devices 35. Therefore, the reference value A is obtained for each power transmission device 35. Here, (1) to (3) in FIG. 8 are used for convenience to identify three different power transmission devices 35. Further, (1)A to (3)A in FIG. 8 represent the current values (standby currents, reference values A) of the respective power transmission devices 35 in the standby state, and (1)T to (3)T represent foreign matter detection thresholds of the respective power transmission devices 35.

Note that the memory of the control circuit 3528 stores the predetermined intervals s and number of times n, which have been preset. Here, an example of the predetermined intervals s is 0.5 seconds, and the predetermined number of times n is a plurality of times, for example, ten times. In this example, the control circuit 3528 measures the standby current ten times at intervals of 0.5 seconds, calculates an average value A of those measured current values, and stores the calculated average value A as a reference value A in the memory.

Further, when the power reception device 23 faces the power transmission device 35, the control circuit 3528 performs authentication processing of confirming whether or not the power reception device 23 is a regular power reception device 23.

Further, the control circuit 3528 performs foreign matter detection processing of detecting a metal foreign matter located between the power transmission device 35 and the power reception device 23.

Here, the metal foreign matter is one, at least a part or all of which is formed of a metal material. Further, the metal foreign matter is present between the power reception device 23 and the power transmission device 35 and present on the power transmission coil 351, and generates heat when the power transmission coil 351 transmits power. Examples of the metal foreign matter include various kinds of foreign matters such as coins, metal pieces, paper pieces or resin films including a metal film of aluminum or the like, clips, and hairpins.

For example, the memory of the control circuit 3528 stores a threshold U, which is a predetermined value for determining whether or not the calculated reference value A is normal. If the reference value A is within the range of the threshold U, the control circuit 3528 determines that the reference value A is normal, and if the reference value A is larger than the threshold U, the control circuit 3528 determines that the reference value A is abnormal.

Further, the control circuit 3528 sets a foreign matter detection threshold T, which is a value larger than the reference value A and is assumed to be generated when a metal foreign matter is present on the power transmission device 35, on the basis of the calculated reference value A. The processing of setting the foreign matter detection threshold T by the control circuit 3528 is performed during the standby state, for example, after the power is turned on and before the power transmission to the power reception device 23 is started. Note that FIG. 7 shows an example of the foreign matter detection threshold T by a broken line.

As first processing of setting the foreign matter detection threshold T, the control circuit 3528 sets the foreign matter detection threshold T based on the reference value (average value) A, for example, when it is determined that the reference value A is normal. Further, as indicated by (1)A to (3)A in FIG. 8, the reference value A is different for each power transmission device 35. Hence, as indicated by (1)T to (3)T in FIG. 8, the control circuit 3528 of each power transmission device 35 sets a foreign matter detection threshold T on the basis of the reference value A of each power transmission device 35, that is, on the basis of the reference value A actually measured for each power transmission device 35.

As a specific example, the control circuit 3528 sets a current value A+α obtained by adding a constant value a to the reference value A as the foreign matter detection threshold T, and stores it in the memory. Further, as another specific example, the control circuit 3528 stores a current value obtained by adding a constant ratio β to the reference value A as the foreign matter detection threshold T in the memory. Here, the current value obtained by adding a constant ratio β to the reference value A is a value (A+A·β), which is obtained by adding a value obtained by multiplying the reference value A by a constant ratio β to the reference value A, and when the constant ratio β is 10% (0.1), the foreign matter detection threshold T is A×1.1. Note that the memory of the control circuit 3528 stores the constant value a and/or the constant ratio β for setting the foreign matter detection threshold T on the basis of the reference value A.

Further, for example, as second processing of setting the foreign matter detection threshold T, if the reference value A is determined to be abnormal, the control circuit 3528 sets a fixed value C, which is a predetermined value of a preset current value, as the foreign matter detection threshold T, and stores the fixed value C in the memory. Here, the fixed value C is a current value larger than the reference value A and is assumed to be generated when a metal foreign matter of a predetermined size is present on the power transmission device 35. Here, examples of the metal foreign matter having a predetermined size include an iron piece having a size of 20 mm square, but the metal foreign matter is not limited to this example. The current value set as a fixed value C is appropriately set on the basis of the size and type of the metal foreign matter to be detected. As an example, the fixed value C is set to a value in which variations in the standby current caused by variations of the power transmission device 35, installation conditions, and the like are assumed, that is, a value with which a metal foreign matter can be determined by any of the power transmission devices 35. In the example of FIG. 8, the fixed value C is set to, for example, a current value of (1)T such that a foreign matter can be detected by the power transmission device 35 having the highest current value (in FIG. 8, (1)A) of the standby current (reference value A) among the assumed power transmission devices 35. Such a fixed value C is then used for all the power transmission devices 35.

As described above, as the processing of setting the foreign matter detection threshold T, the control circuit 3528 sets the foreign matter detection threshold T on the basis of the reference value A calculated for each power transmission device 35 or sets a preset fixed value C if the reference value A cannot be used due to abnormality.

As the foreign matter detection processing, the control circuit 3528 compares the foreign matter detection threshold T set in the first setting processing or the second setting processing with the current value detected by the current sensor 3526 and/or the current detection circuit 3527, and detects the foreign matter. For example, as indicated by a dashed-dotted line in FIG. 7, when a metal foreign matter is disposed on the power transmission device 35, the current value fluctuates with a fluctuation value larger than the standby current. When the current value detected by the current sensor 3526 and/or the current detection circuit 3527 exceeds the foreign matter detection threshold T and is different from a normal current value, such as when the power reception device 23 is not authenticated, the control circuit 3528 determines that a metal foreign matter has been detected.

When determining that the metal foreign matter is detected, the control circuit 3528 controls the switching circuit 3524 to enter a power transmission stop state in which a magnetic field is not generated in the power transmission coil 351, and prevents overheating of the metal foreign matter. Further, when the metal foreign matter is not detected and the power reception device 23 is authenticated, the control circuit 3528 controls the switching circuit 3524 to generate a magnetic field corresponding to the transmission power in the power transmission coil 351 and to transmit power to the power reception device 23.

Note that, as shown in FIG. 7, when no foreign matter is detected after the authentication of the power reception device 23 is established, the control circuit 3528 transmits power from the power transmission device 35 to the power reception device 23 and transfers to the charging operation.

As in those examples, the control circuit 3528 controls each configuration and performs various types of processing on the basis of information such as various programs and parameters stored in the memory.

The AC adaptor 354 is disposed outside the casing 350, for example, and is connected to the power transmission substrate.

Next, an example of the method of controlling the power transmission device 35 of the power supply system 1 according to this embodiment will be described with reference to FIGS. 5 and 6. FIG. 5 is a flowchart showing a series of processing relating to the power transmission by the power transmission device 35. FIG. 6 is a flowchart showing processing relating to setting of a foreign matter detection threshold. Note that, in this embodiment, an example is provided in which the authentication processing and the foreign matter detection processing are performed with the standby current, but the current for authentication and the current for foreign matter detection may have different current values.

As shown in FIG. 5, when the power transmission device 35 is turned on, in ACT1, the control circuit 3528 first performs the setting processing of setting the foreign matter detection threshold T. As shown in FIG. 6, the control circuit 3528 performs processing of ACT11 to ACT14 as the processing of setting the foreign matter detection threshold T. First, in ACT11 shown in FIG. 6, the control circuit 3528 takes in a current value. The control circuit 3528 then calculates a reference value A as an average value. As a specific example, the control circuit 3528 measures the current value by a predetermined number of times n at predetermined intervals s, which are stored in the memory. The control circuit 3528 calculates the average value A from the measured current values. The control circuit 3528 sets the average value A as the reference value A and stores the average value A in the memory. Next, in ACT12, the control circuit 3528 compares the calculated reference value A with the threshold U stored in the memory. The control circuit 3528 then determines whether or not the reference value A is normal as the current value of the standby current.

When the reference value A is normal (Yes in ACT12), the processing of the control circuit 3528 proceeds to ACT13.

In ACT13, the control circuit 3528 sets a current value (A+$\alpha$) obtained by adding a constant value a to the reference value A as the foreign matter detection threshold T or sets a current value (A+A·$\beta$) obtained by adding a constant ratio $\beta$ to the reference value A as the foreign matter detection threshold T, and stores it in the memory.

When the reference value A is abnormal (No in ACT12), the processing of the control circuit 3528 proceeds to ACT14. In ACT14, the control circuit 3528 sets the fixed value C stored in the memory as the foreign matter detection threshold T and stores it in the memory. Through the processing of ACT11 to ACT14, the control circuit 3528 sets the foreign matter detection threshold T as ACT1.

Next, in ACT2, the control circuit 3528 keeps the standby state until the authentication processing is performed, and then performs the foreign matter detection processing. For example, as the standby state, the control circuit 3528 continues power transmission from the power transmission coil 351 with the standby current. Further, during the standby state, as the foreign matter detection processing, the control circuit 3528 compares the current value detected by the current sensor 3526 and/or the current detection circuit 3527 with the set foreign matter detection threshold T. If the current value detected by the current sensor 3526 and/or the current detection circuit 3527 does not exceed the foreign matter detection threshold T, the control circuit 3528 continues the standby state by determining that a metal foreign matter is not detected. Note that if the current value detected by the current sensor 3526 and/or the current detection circuit 3527 exceeds the foreign matter detection threshold T, the control circuit 3528 determines that a metal foreign matter is detected, and stops power transmission, for example.

Next, in ACT3, when the power reception device 23 faces the power transmission device 35, the control circuit 3528 performs the authentication processing for confirming whether or not the power reception device 23 is a normal power reception device 23. For example, the control circuit 3528 performs, as a load modulation method, a load modulation corresponding to the ID in the power reception unit, and detects the change in the current corresponding to the ID on the power transmission side, thus performing the authentication. Note that the control circuit 3528 may perform authentication determination by inquiring and answering the ID between the power transmission device and the power reception device by using a wireless communication means such as wireless communication or infrared communication.

Next, in ACT4, it is determined whether or not the power reception device 23 facing the power transmission device 35 is a normal power reception device as a result of the confirmation in the authentication processing. If it is determined that the power reception device 23 is a normal power reception device (Yes in ACT4), the processing of the control circuit 3528 proceeds to ACT5. In ACT5, the control circuit 3528 performs normal power transmission to the power reception device 23, and starts to charge the secondary battery 222. Specifically, the control circuit 3528 transmits power for a predetermined period of time at a current value for charging. On the other hand, if it is determined that the power reception device 23 is not a normal power reception device (No in ACT4), the control circuit 3528 does not start normal power transmission (charging) processing. The processing of the control circuit 3528 returns to the standby state of ACT2.

After the charging is started in ACT5, the processing of the control circuit 3528 proceeds to ACT6. In ACT6, the control circuit 3528 determines whether or not a charging termination condition is satisfied. If it is determined that the charging termination condition is satisfied (Yes in ACT6), the processing of the control circuit 3528 processes to ACT7. In ACT7, the control circuit 3528 stops the power transmission by determining the termination of charging. After the power transmission is stopped, the processing of the control circuit 3528 returns to the standby state of ACT2. On the other hand, if it is determined that the charging termination condition is not satisfied (No in ACT6), the control circuit 3528 continues the charging processing. Here, the charging termination condition includes a case where the secondary battery 222 is fully charged or the power reception device 23 moves and is not present on the power transmission device 35.

According to the power transmission device 35 and the power supply system 1 configured as described above, the foreign matter detection threshold T for detecting the metal foreign matter can be set on the basis of the reference value A obtained by measuring the standby current after power is turned on, for example. Here, for example, the foreign matter detection threshold T is a value obtained by adding the constant value a to the reference value A or a value obtained by adding the constant ratio β to the reference value A. Thus, the power transmission device 35 can set, as the foreign matter detection threshold T, a slightly larger current value than the standby current in a state in which there is no metal foreign matter in the standby state for each power transmission device 35. Therefore, regardless of variations in performance and characteristics of each power transmission device 35 or the environment in which each power transmission device 35 is installed, the power transmission device 35 can detect a foreign matter with high sensitivity and can suppress erroneous detection of a metal foreign matter.

The standby current fluctuates depending on variations in characteristics of components (e.g., electronic components, coils, and the like) constituting the power transmission device 35 and the surrounding environment in which the power transmission device 35 is installed. Here, the surrounding environment of the place where the power transmission device 35 is installed is, for example, the material (iron, aluminum, wood, or the like) of the cart base 3 in which the power transmission device 35 is installed, the floor, or the like. However, since the power transmission device 35 uses the foreign matter detection threshold T in the foreign matter detection processing by using the reference value A obtained from the actual measurement value during the standby state, e.g., after the power-on of each installed power transmission device 35, it is possible to detect a foreign matter with high sensitivity and to suppress erroneous detection of a metal foreign matter.

Further, setting, as the reference value A, the average value A calculated from the current values detected by the predetermined number of times n at the predetermined intervals s also makes it possible to suppress the variations of the reference value A due to the fluctuating standby current. In other words, by setting the average value A as the reference value A on the assumption that the standby current fluctuates during the standby state, it is not necessary to set the foreign matter detection threshold with a certain margin in order to avoid erroneous detection of a foreign matter. Therefore, the power transmission device 35 can also detect a metal foreign matter having a small change in current, such as a metal foreign matter with a small size, without sacrificing the foreign matter detection sensitivity.

Further, the power transmission device 35 compares the obtained reference value A with the threshold U to determine whether or not the reference value is normal, and sets the fixed value C as the foreign matter detection threshold T when the reference value is determined to be abnormal. Thus, the power transmission device 35 can prevent the foreign matter detection threshold T from being set on the basis of the reference value A, which is a higher current value than the normal current value due to the metal foreign matter when the metal foreign matter is present on the power transmission device 35.

According to the power transmission device 35 and the power supply system 1 of the embodiment described above, it is possible to achieve both highly sensitive foreign matter detection and suppression of erroneous detection by using the foreign matter detection threshold T, which is set on the basis of the reference value A obtained from the standby current, in the foreign matter detection processing.

Note that the power transmission device 35 and the power supply system 1 are not limited to those exemplified in the embodiment described above. Next, a power transmission device 35A and a power supply system 1 according to a second embodiment will be described with reference to FIGS. 9 and 10. Note that, in the power transmission device 35A and the power supply system 1 according to the second embodiment, the components similar to those of the power transmission device 35 and the power supply system 1 according to the first embodiment described above will be denoted by the same reference numerals, and detailed description thereof will be omitted.

Figure 9:
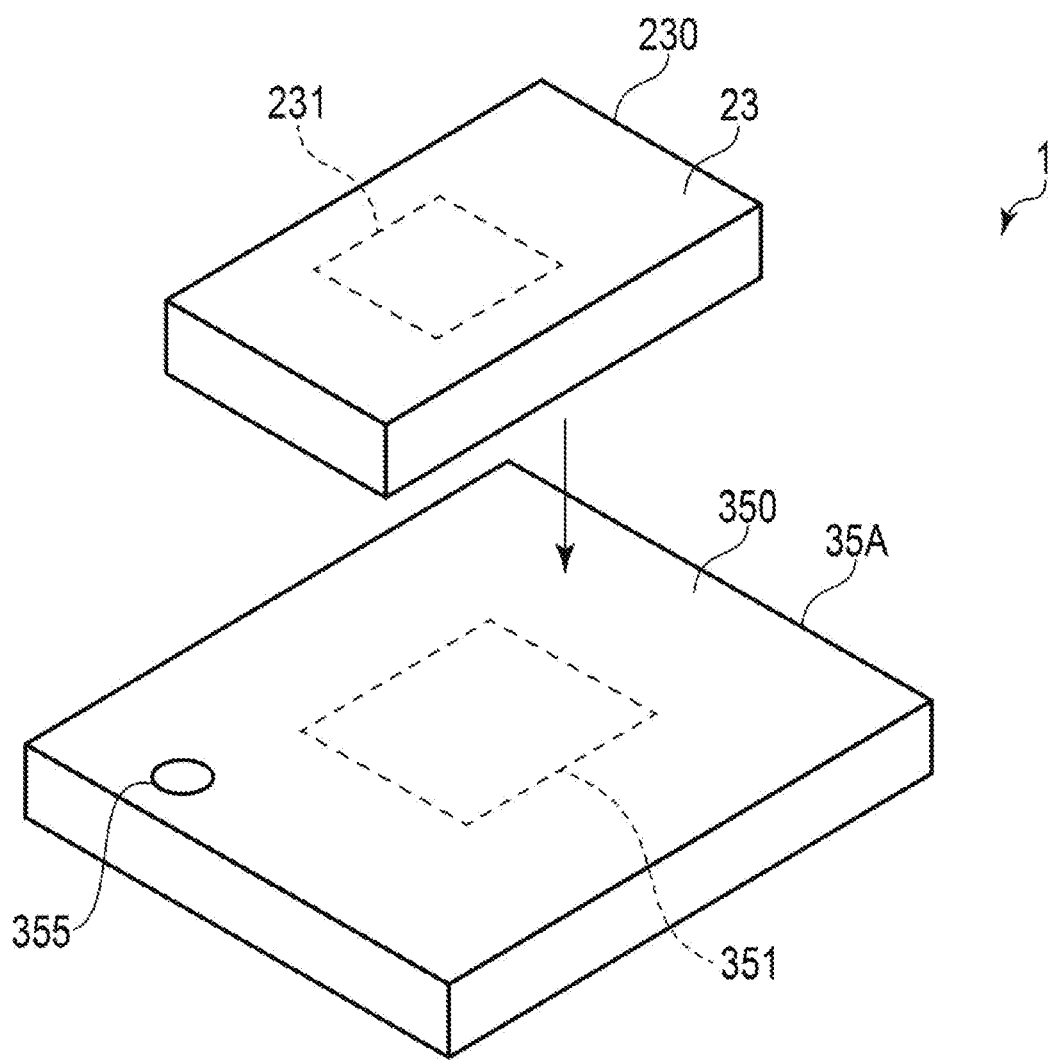
FIG. 9 is a perspective view showing configurations of a power reception device and a power transmission device of a power supply system according to a second embodiment.
Figure 10:
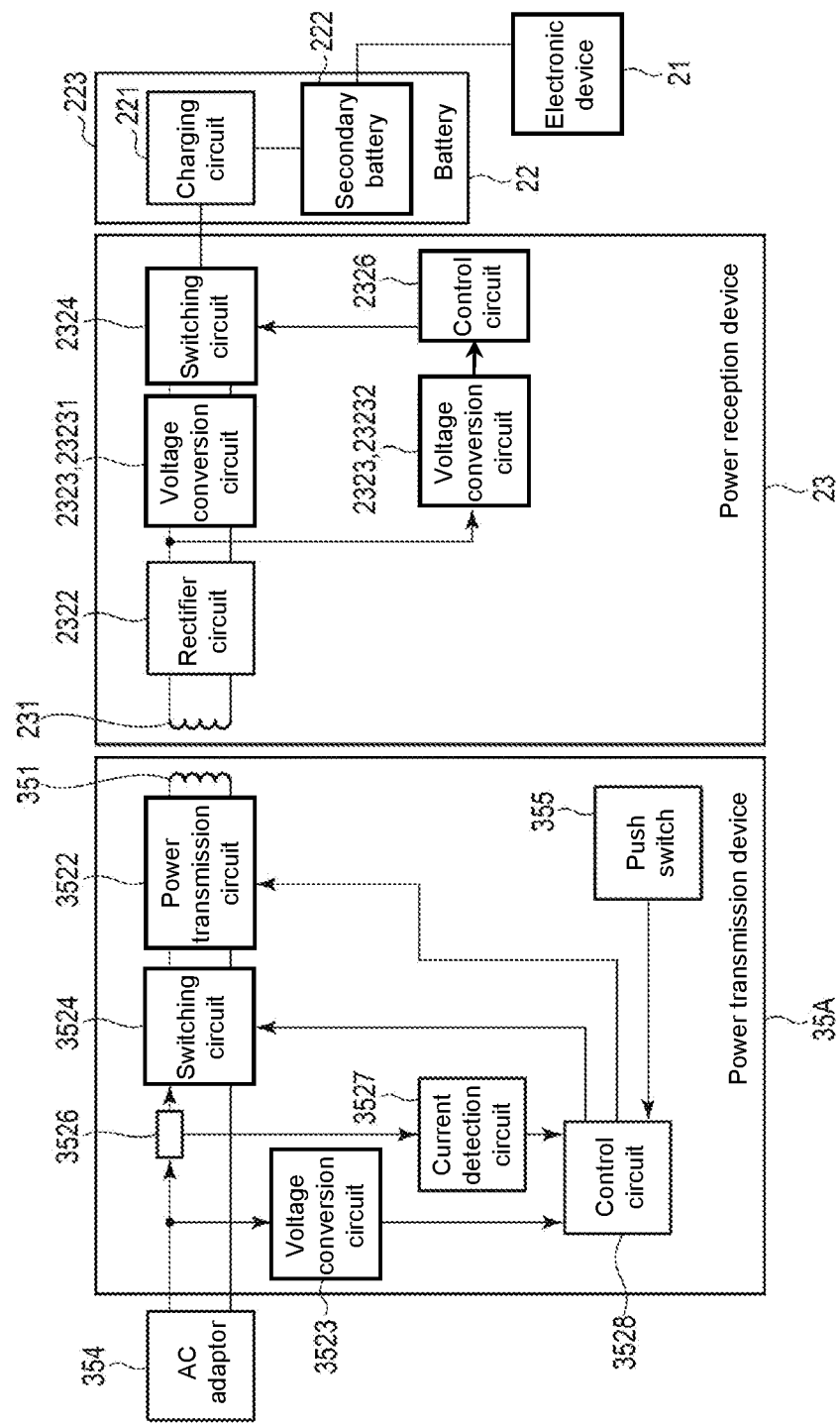
FIG. 10 is a block diagram showing a configuration of a control system of the power supply system according to the second embodiment.

FIG. 9 is a perspective view showing the configurations of a power reception device 23 and the power transmission device 35A of the power supply system 1 according to the second embodiment. FIG. 10 is a block diagram showing the configuration of a control system of the power supply system 1 according to the second embodiment.

As shown in FIG. 9, the power supply system 1 includes the power reception device 23 and the power transmission device 35A. For example, a plurality of power transmission devices 35A are provided in a cart base 3 that houses a plurality of carts 2.

For example, the plurality of power transmission devices 35A are provided between a pair of guide grooves 313 of a guide base 31, in which a pair of front wheels 153 of the cart 2 is guided. The plurality of power transmission devices 35A are disposed side by side in the extending direction of the pair of guide grooves 313 of the guide base 31. The plurality of power transmission devices 35A face the power reception devices 23 of the plurality of carts 2 stacked and kept in the cart base 3. The power transmission device 35A transmits power to the power reception device 23 of the cart 2 opposed thereto in a non-contact manner.

As shown in FIG. 9, the power transmission device 35A includes, for example, a casing 350, a power transmission coil 351, a power transmission substrate, an AC adaptor 354, and a switch 355.

The switch 355 is an external trigger. As shown in FIG. 9, the switch 355 is exposed to the outer surface side of the casing 350 and is provided to be operable from the outside. The switch 355 outputs information of the operation, as a signal, to a control circuit 3528. The switch 355 is, for example, a push switch that outputs a signal to the control circuit 3528 by a pressing operation.

The control circuit 3528 then performs setting processing of setting a foreign matter detection threshold T when receiving the signal indicating that the switch 355 is operated. Note that when the switch 355 is operated, the operator confirms that there is no metal foreign matter on the casing 350 and then operates the switch 355. In other words, when the operator operates the switch 355, the control circuit 3528 determines that the operator has confirmed that there is no metal foreign matter on the casing 350 of the power transmission device 35A. The control circuit 3528 then sets the foreign matter detection threshold T on the basis of the calculated reference value A. Thus, if the foreign matter detection threshold T is set with the operation of the switch 355 as an external trigger, the control circuit 3528 does not perform the above processing of determining whether or not the reference value A is normal in ACT12 and of setting the fixed value C to the foreign matter detection threshold T in ACT14. After calculating the reference value A (ACT11), the control circuit 3528 only needs to set the foreign matter detection threshold T on the basis of the reference value A (ACT13).

With such a configuration, the power transmission device 35A can perform the processing of setting the foreign matter detection threshold T after confirming that the power reception device 23 does not face the power transmission device 35A and that there is no metal foreign matter on the power transmission device 35A, with the operation of the switch 355 as a trigger for starting to set the foreign matter detection threshold T. This makes it possible for the power transmission device 35A to set the foreign matter detection threshold T on the basis of a normal reference value A. As a result, the power transmission device 35A can perform reliable threshold setting in addition to achieving both highly sensitive foreign matter detection and suppression of erroneous detection as in the first embodiment described above.

Note that the power transmission device 35A performs the processing of setting the foreign matter detection threshold in ACT11 to ACT14 of the first embodiment if the switch 355 is not operated for a predetermined period of time after the power is turned on or after the power transmission to the power reception device 23 is stopped. Further, the power transmission device 35A may perform the processing of setting the foreign matter detection threshold in ACT11 and ACT13 of the second embodiment if the switch 355 is operated within a predetermined period of time.

Next, a power transmission device 35B and a power supply system 1 according to a third embodiment will be described with reference to FIGS. 11 to 13. Note that, in the power transmission device 35B and the power supply system 1 according to the third embodiment, components similar to those of the power transmission device 35 and the power supply system 1 according to the first embodiment and the power transmission device 35A and the power supply system 1 according to the second embodiment described above will be denoted by the same reference numerals, and detailed description thereof will be omitted.

Figure 11:
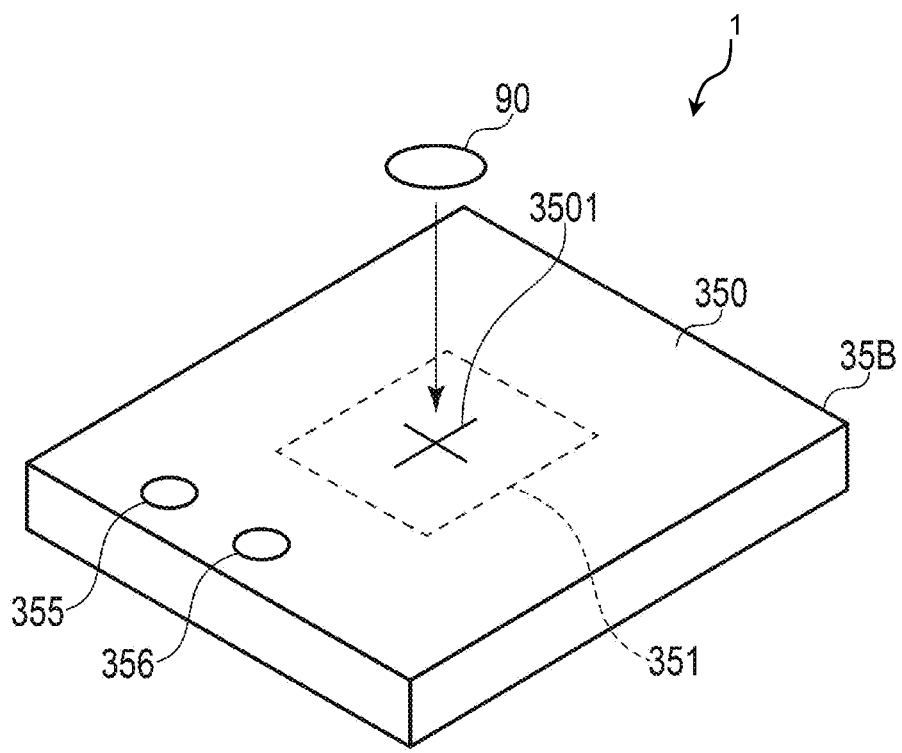
FIG. 11 is a perspective view showing a configuration of a power transmission device of a power supply system according to a third embodiment.

FIG. 11 is a perspective view showing a configuration of the power transmission device 35B of the power supply system 1 according to the third embodiment. FIG. 12 is a block diagram showing a configuration of a control system of the power supply system 1 according to the third embodiment. FIG. 13 is a flowchart showing an example of processing of setting a foreign matter detection threshold in the power supply system 1 according to the third embodiment.

As shown in FIG. 11, the power supply system 1 includes a power reception device 23 and the power transmission device 35B. The power reception device 23 is provided in, for example, a cart 2. For example, a plurality of power transmission devices 35B are provided in a cart base 3 that houses the plurality of carts 2.

For example, the plurality of power transmission devices 35B are provided between a pair of guide grooves 313 of a guide base 31, in which a pair of front wheels 153 of the cart 2 is guided. The plurality of power transmission devices 35B are disposed side by side in the extending direction of the pair of guide grooves 313 of the guide base 31. The plurality of power transmission devices 35B face the power reception devices 23 of the plurality of carts 2 stacked and kept in the cart base 3. The power transmission device 35B transmits power to the power reception device 23 of the cart 2 opposed thereto in a non-contact manner.

Figure 12:
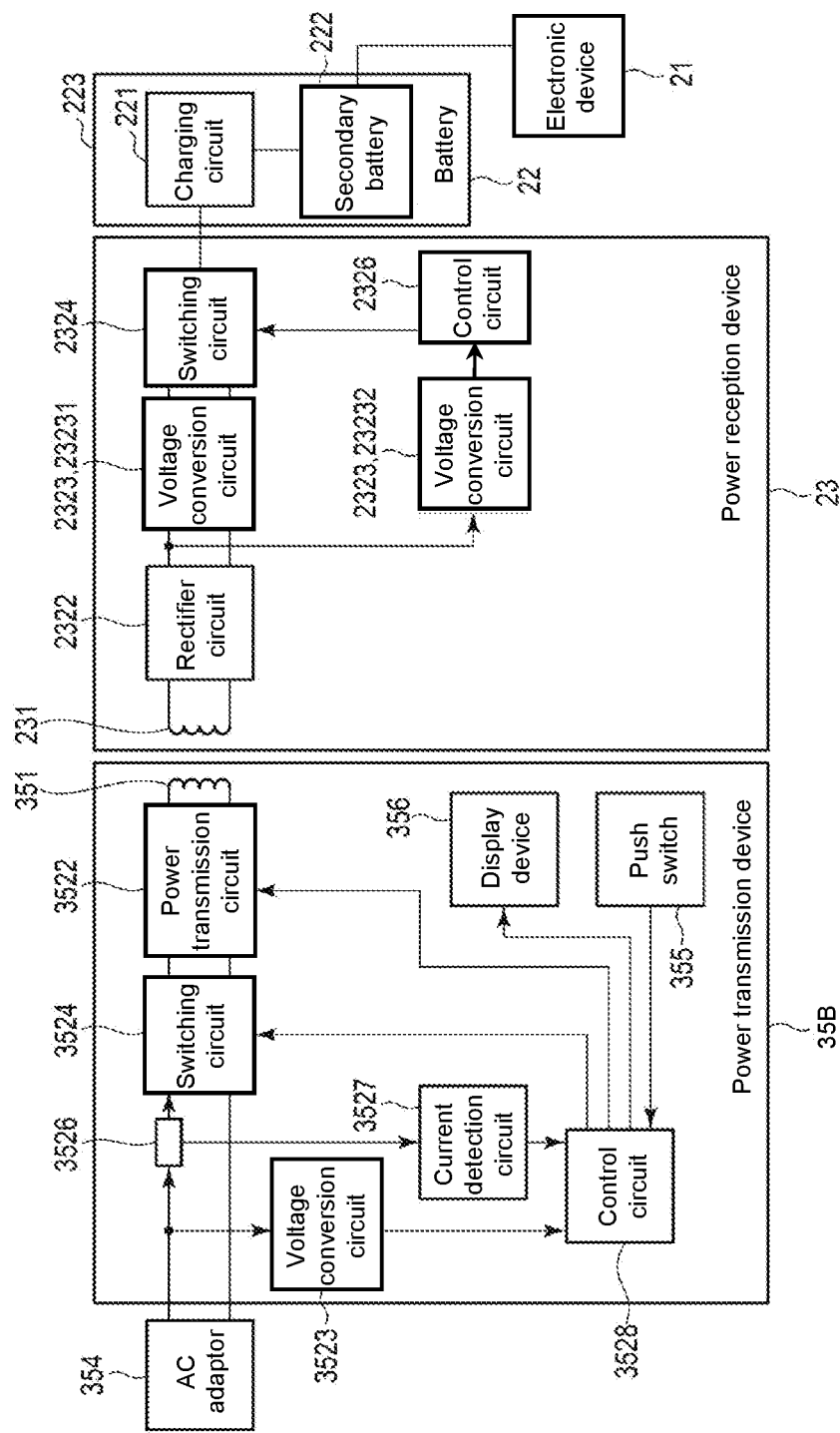
FIG. 12 is a block diagram showing a configuration of a control system of the power supply system according to the third embodiment.
Figure 13:
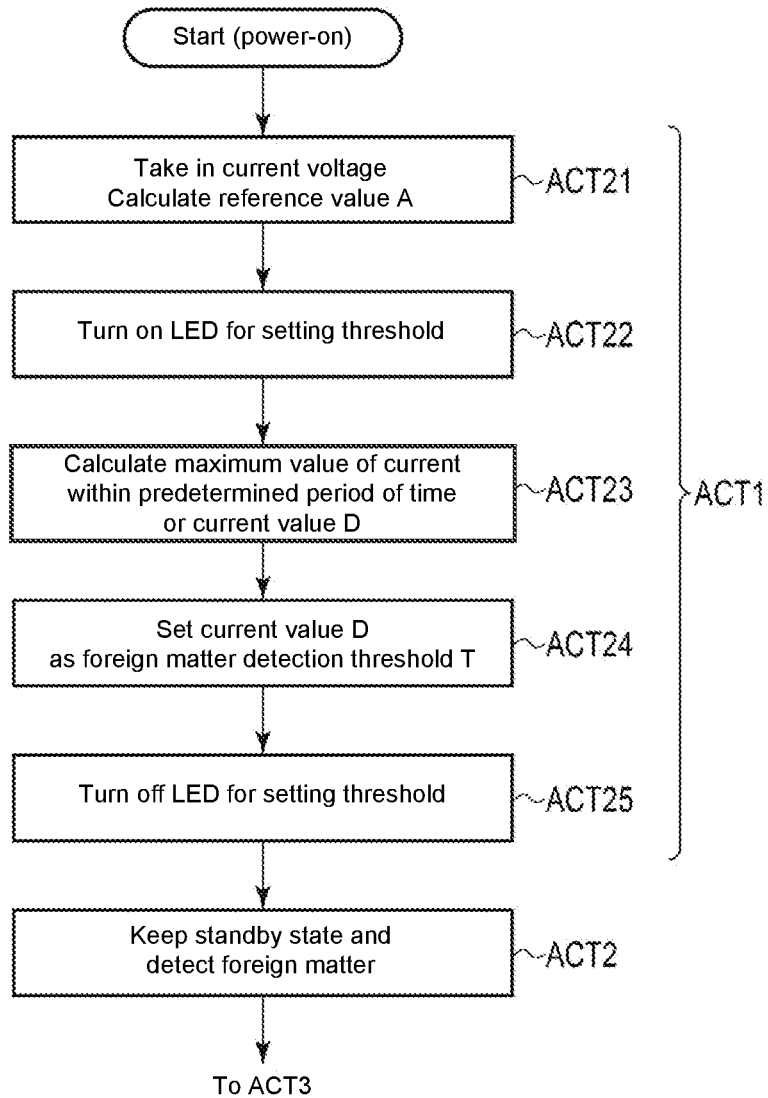
FIG. 13 is a flowchart showing an example of processing of setting a foreign matter detection threshold in the power supply system according to the third embodiment.

As shown in FIGS. 11 and 12, the power transmission device 35B includes, for example, a casing 350, a power transmission coil 351, a power transmission substrate, an AC adaptor 354, a switch 355, and a display device 356.

As shown in FIG. 11, the casing 350 includes a guide portion 3501 on a part of a region, which is the outer surface and in which the power transmission coil 351 is provided. The guide portion 3501 is a mark for indicating a specific location by printing, unevenness, a seal, or the like. The guide portion 3501 indicates a position where a metal test piece 90 for obtaining a foreign matter detection threshold T is disposed in the processing of setting the foreign matter detection threshold T by the control circuit 3528.

The switch 355 is an external trigger. As shown in FIG. 11, the switch 355 is exposed to the outer surface side of the casing 350 and is provided to be operable from the outside. The switch 355 outputs information of the operation, as a signal, to a control circuit 3528. The switch 355 is, for example, a push switch that outputs a signal to the control circuit 3528 by a pressing operation.

The display device 356 displays or notifies information to the outside. As shown in FIG. 11, the display device 356 is a display unit that is exposed to a part of the outer surface of the casing 350 to provide information in a manner visually recognizable from the outside of the casing 350. As shown in FIG. 12, the display device 356 is connected to the control circuit 3528 and performs specific display or notification on the basis of a command from the control circuit 3528. The display device 356 is, for example, an LED. The display device 356 can emit light in a plurality of different colors. The display device 356 displays different types of information according to a display method such as a color to be displayed, lighting, turning off, and/or blinking. Note that the display device 356 is not limited to the LED and may be a display, a segment, or the like.

The control circuit 3528 performs setting processing of setting the foreign matter detection threshold T as ACT1 if receiving the signal indicating that the switch 355 is operated. In performing the processing of setting the foreign matter detection threshold T, the control circuit 3528 detects a current value that is increased more than the standby current due to the metal test piece 90 artificially disposed on the guide portion 3501, for example, with the operation of the switch 355 as a trigger. The control circuit 3528 then sets the detected current value or a current value lower than the detected current value and higher than the standby current as the foreign matter detection threshold T.

Such procedure of the operation of the switch 355 and the arrangement of the metal test piece 90 in the processing of setting the foreign matter detection threshold T is appropriately determined by the method of controlling the control circuit 3528. For example, the following control may be performed, in which the metal test piece 90 is disposed on the guide portion 3501 when the operator operates the switch 355 or within a predetermined period of time after the operator operates the switch 355. Further, for example, the operator may confirm that the processing of setting the foreign matter detection threshold T is being performed on the basis of the display of the display device 356, and then operate the switch 355 after placing the metal test piece 90 on the guide portion 3501.

Next, an example of the processing of setting the foreign matter detection threshold (ACT1) by the power transmission device 35B configured as described above will be described with reference to the flowchart of FIG. 13. When the power supply is turned on, the control circuit 3528 starts to set the foreign matter detection threshold T (ACT1). As a specific example, as shown in FIG. 13, the control circuit 3528 first takes in a current value in ACT21 as the processing of setting the foreign matter detection threshold T. The control circuit 3528 then calculates a reference value A that is an average value. As a specific example, the control circuit 3528 measures a current value that is a standby current by a predetermined number of times n at predetermined intervals s, which are stored in the memory. The control circuit 3528 calculates an average value A from the measured current values. The control circuit 3528 sets the average value A as the reference value A, and stores it in the memory.

Next, in ACT22, the control circuit 3528 controls the display device 356 to turn on or blink the LED in a predetermined color, for example. Thus, the control circuit 3528 notifies the outside of the fact that the foreign matter detection threshold T is being set.

Note that the operator who performs the processing of setting the foreign matter detection threshold T disposes the metal test piece 90 on the guide portion 3501 and operates the switch 355. In ACT23, upon receiving a signal from the switch 355, the control circuit 3528 determines that the installation of the metal test piece 90 has been completed. The control circuit 3528 then measures the current by a current sensor 3526 and/or a current detection circuit 3527, and detects a current value D that becomes the foreign matter detection threshold T. Here, the current value D is the maximum value of the current detected within a predetermined period of time t, or an average value calculated from the current values detected by the predetermined number of times n at the predetermined intervals s. Note that the memory of the control circuit 3528 stores the predetermined period of time t, the predetermined intervals s, and/or the predetermined number of times n, which are preset. Further, the predetermined intervals s and the predetermined number of times n of this embodiment may be the same as or different from the predetermined intervals s and the predetermined number of times n for determining the reference value A.

In addition, in ACT24, the control circuit 3528 sets the obtained current value D to the foreign matter detection threshold T. Subsequently, in ACT25, the control circuit 3528 then controls the display device 356 to notify the outside of the fact that the setting of the foreign matter detection threshold T has been completed. Note that, here, the control circuit 3528 notifies the outside of the completion of the setting of the foreign matter detection threshold T, in a manner different from the display method for the display device 356 in ACT22. For example, in ACT25, the control circuit 3528 may turn off the LED or change the color of the LED. The control circuit 3528 then performs ACT2 and subsequent processing.

With such a configuration, the power transmission device 35B can set the foreign matter detection threshold T on the basis of the metal test piece 90 for each power transmission device 35B, so that both highly sensitive foreign matter detection and suppression of erroneous detection can be achieved.

Since the target value of the foreign matter detection threshold T can be set depending on the shape or material of the metal test piece 90, the power transmission device 35B can set the foreign matter detection threshold T in consideration of the size or the like of the metal foreign matter to be detected.

Note that, depending on the shape or the like of the power transmission coil 351, the amount of heat generated by the metal foreign matter may vary with the position of the metal foreign matter on the power transmission coil 351 even if the same metal foreign matter is used. In other words, the current flowing in the power transmission coil 351 may differ depending on the relative positions of the metal foreign matter and the power transmission coil 351. Hence, if the position on the casing 350 on which the guide portion 3501 is displayed is set on the basis of the current value of the current flowing by the metal foreign matter, it is possible to manage the threshold when the metal test piece 90 is disposed in the guide portion 3501. Accordingly, the sensitivity can be set to be high or low depending on the position where the guide portion 3501 is provided. Note that the position where the guide portion 3501 is provided may be the center of the power transmission coil 351 or a position deviated from the center. Specifically, the position may be a position deviated from the center of the power transmission coil 351 and directly above the coil copper wire. Further, the following configuration may be adopted, in which the guide portions 3501 are provided at a plurality of locations where the amount of heat generation of the metal foreign matter differs, to select a position where the metal test piece 90 is to be disposed on the basis of the foreign matter detection thresholds T to be set by the plurality of guide portions 3501.

Note that, for example, the power transmission device 35B may obtain the reference value A (ACT21) as the processing of setting the foreign matter detection threshold T (ACT1), and then determine whether or not the reference value A is normal to be the current value of the standby current as shown in ACT12. In such a configuration, the control circuit 3528 only needs to perform the processing of ACT22 and subsequent processing when it is determined that the reference value A is normal, and to set the fixed value C to the foreign matter detection threshold T as shown in ACT14 when it is determined that the current value is abnormal.

Further, for example, the power transmission device 35B performs the processing of setting the foreign matter detection threshold in ACT11 to ACT14 of the first embodiment when the switch 355 is not operated for a predetermined period of time after the power is turned on or after the power transmission to the power reception device 23 is stopped. Further, the power transmission device 35B may perform the processing of setting the foreign matter detection threshold T using the metal test piece 90 when the switch 355 is operated within a predetermined period of time.

Further, for example, when the display device 356 is displaying the information indicating that the foreign matter detection threshold T is being set, the power transmission device 35B may be able to select either the processing of setting the foreign matter detection threshold T using the metal test piece 90 or the processing of setting the foreign matter detection threshold T in the second embodiment described above on the basis of the signal input by the different operation methods for the switch 355. For example, if a signal corresponding to one short operation of the switch 355 is input, the control circuit 3528 determines that the processing of setting the foreign matter detection threshold T using the metal test piece 90 in the third embodiment has been selected. If a signal corresponding to two short operations of the switch 355 is input, the control circuit 3528 determines that the processing of setting the foreign matter detection threshold T in the second embodiment has been selected. Subsequently, the control circuit 3528 may perform the selected processing of setting the selected foreign matter detection threshold T.

In other words, the power transmission device according to the embodiment may perform any processing of setting the foreign matter detection threshold T according to the embodiments described above or may selectively perform all types of the setting processing.

Further, in the examples of the embodiments described above, a shopping cart has been described as an example, in which the power reception device 23 of the power supply system 1 that supplies power in a non-contact manner is used in the cart 2. However, the cart 2 equipped with the power reception device 23 is not limited to a shopping cart, and may be, for example, a picking cart used in a warehouse or the like. Further, the power reception device 23 and the power transmission device 35 can also be applied to configurations other than the cart 2 and the cart base 3 as long as the power supply system 1 performs non-contact power supply.

According to the power transmission device and the power supply system of at least one embodiment described above, setting the foreign matter detection threshold T on the basis of the reference value A obtained from the standby current makes it possible to achieve both highly sensitive foreign matter detection and suppression of erroneous detection.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A power transmission device, which performs power transmission without contact with a power reception device, comprising:
    a power transmission coil;
    a power transmission circuit that generates transmission power and supplies the generated transmission power to the power transmission coil;
    a current detection circuit that measures a current value input to the power transmission circuit; and
    a control circuit that
        measures, using the current detection circuit, a standby current in a standby state in which the power transmission to the power reception device is not performed, to obtain the measured current value as a reference value,
        sets, as a foreign matter detection threshold, a value obtained by adding a constant value to the reference value or a value obtained by adding a constant ratio to the reference value, and
        determines, in the standby state, when the current value detected by the current detection circuit is equal to or larger than the foreign matter detection threshold, that there is a foreign matter on the power transmission coil.

2. The power transmission device according to claim 1, wherein
    the control circuit obtains the reference value after power is turned on and before the power transmission to the power reception device is started.

3. The power transmission device according to claim 1, further comprising
    an external trigger, wherein
    the control circuit obtains, in the standby state, when the external trigger is operated, the reference value to set the foreign matter detection threshold.

4. The power transmission device according to claim 1, further comprising
    a display unit that displays information indicating that threshold setting processing is being performed, wherein
    the control circuit
        measures the standby current in the standby state by using the current detection circuit, and
        controls the display unit to display the information indicating that the threshold setting processing is being performed, and obtains a current value of the measured standby current as the reference value during the threshold setting processing, to set the foreign matter detection threshold.

5. A power transmission device, which performs power transmission without contact with a power reception device, comprising:
    a power transmission coil;
    a power transmission circuit that generates transmission power and supplies the generated transmission power to the power transmission coil;
    a current detection circuit that measures a current value input to the power transmission circuit;
    a display unit that displays information indicating that threshold setting processing is being performed; and
    a control circuit that
        measures, using the current detection circuit, a standby current in a standby state in which the power transmission to the power reception device is not performed, and
        controls the display unit to display the information indicating that the threshold setting processing is being performed, and obtains a current value of the measured standby current as the reference value during the threshold setting processing, to set a foreign matter detection threshold on a basis of the obtained reference value.

6. A power supply system, which supplies power to an object to be supplied with power, comprising:
    a power reception device that receives power transmitted in a non-contact manner and supplies the received power to the object to be supplied with power; and a power transmission device that performs power transmission to the power reception device in a non-contact manner when facing the power reception device, wherein the power transmission device comprises
- a power transmission coil that is electromagnetically coupled to the power reception device when facing the power reception device,
- a power transmission circuit that generates transmission power and supplies the generated transmission power to the power transmission coil,
- a current detection circuit that measures a current value input to the power transmission circuit, and
- a control circuit that
  - measures, using the current detection circuit, a standby current in a standby state in which the power transmission to the power reception device is not performed, to obtain the measured current value as a reference value,
  - sets, as a foreign matter detection threshold, a value obtained by adding a constant value to the reference value or a value obtained by adding a constant ratio to the reference value, and
  - determines, in the standby state, when the current value detected by the current detection circuit is equal to or larger than the foreign matter detection threshold, that there is a foreign matter on the power transmission coil.

7. The power supply system according to claim 6, wherein the control circuit obtains the reference value after power is turned on and before the power transmission to the power reception device is started.

8. The power supply system according to claim 6, wherein the power transmission device further includes an external trigger, and the control circuit obtains, in the standby state, when the external trigger is operated, the reference value to set the foreign matter detection threshold.

9. The power supply system according to claim 6, wherein the power transmission device further includes a display unit that displays information indicating that threshold setting processing is being performed, and the control circuit
- measures the standby current in the standby state by using the current detection circuit, and
- controls the display unit to display the information indicating that the threshold setting processing is being performed, and obtains a current value of the measured standby current as the reference value during the threshold setting processing, to set the foreign matter detection threshold.

10. The power supply system according to claim 6, wherein the power transmission device further includes
- an external trigger, and
- a display unit that displays information indicating that threshold setting processing is being performed, and in the standby state, when the external trigger is operated, the control circuit
- measures the standby current in the standby state by using the current detection circuit, and
- controls the display unit to display the information indicating that the threshold setting processing is being performed, and obtains a current value of the measured standby current as the reference value during the threshold setting processing, to set the foreign matter detection threshold.

\* \* \* \* \*